US012156363B2

(12) United States Patent
Carver et al.

(10) Patent No.: US 12,156,363 B2
(45) Date of Patent: Nov. 26, 2024

(54) HIGH-DENSITY CHASSIS SUPPORTING REPLACEABLE HARDWARE ACCELERATORS

(71) Applicant: Dell Products, L.P., Round Rock, TX (US)

(72) Inventors: Walter R. Carver, Round Rock, TX (US); Douglas Simon Haunsperger, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 188 days.

(21) Appl. No.: 17/816,042

(22) Filed: Jul. 29, 2022

(65) Prior Publication Data

US 2024/0040734 A1    Feb. 1, 2024

(51) Int. Cl.
*H05K 7/14* (2006.01)
*G06F 1/18* (2006.01)
*G06F 1/20* (2006.01)
*H05K 7/20* (2006.01)

(52) U.S. Cl.
CPC .......... *H05K 7/1487* (2013.01); *G06F 1/183* (2013.01); *G06F 1/20* (2013.01); *H05K 7/20727* (2013.01)

(58) Field of Classification Search
CPC .. H05K 7/1487; H05K 7/20727; G06F 1/183; G06F 1/20; G06F 1/185; G06F 1/188
See application file for complete search history.

(56) References Cited

U.S. PATENT DOCUMENTS

| | | | | |
|---|---|---|---|---|
| 5,721,669 | A * | 2/1998 | Becker | G11B 33/124 |
| 2014/0029194 | A1* | 1/2014 | Hayashi | G06F 1/20 |
| | | | | 361/679.48 |
| 2017/0150621 | A1* | 5/2017 | Breakstone | H05K 7/20736 |
| 2018/0157295 | A1* | 6/2018 | Zhu | H05K 5/023 |
| 2020/0021449 | A1* | 1/2020 | Ganguli | H04L 43/0876 |
| 2021/0124590 | A1* | 4/2021 | Itkin | G06F 9/4408 |
| 2021/0232331 | A1* | 7/2021 | Kannan | G06N 20/00 |
| 2021/0392797 | A1* | 12/2021 | Latuperissa | H05K 7/1489 |
| 2022/0318181 | A1* | 10/2022 | Cannata | G06F 9/4411 |

* cited by examiner

*Primary Examiner* — Abhishek M Rathod
*Assistant Examiner* — Keon Kim
(74) *Attorney, Agent, or Firm* — Fogarty LLP

(57) ABSTRACT

Systems provide a chassis housing one or more Information Handling Systems (IHSs). A control layer of the chassis includes a power supply for use both in the control layer of the chassis and in a processing layer of the chassis. The control layer also includes a motherboard with CPUs coupled to the processing layer via a PCIe switch fabric. The processing layer includes one or more replaceable I/O modules installed in a front compartment. The processing layer also includes a hardware accelerator sled installed in a central compartment of the processing layer, where the hardware accelerator sled is replaceable via a rear of the processing layer. A block of cooling fans is installed in a rear compartment of the processing layer, where the fans provide airflow cooling to the I/O modules and hardware accelerator sled installed in the processing layer. In this configuration, cooling requirements are met for the chassis.

20 Claims, 7 Drawing Sheets

HIGH-DENSITY CHASSIS SUPPORTING REPLACEABLE HARDWARE ACCELERATORS

FIELD

The present disclosure relates generally to Information Handling Systems (IHSs), and relates more particularly to supporting replaceable hardware accelerators in a chassis housing one or more IHSs.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as servers, that are installed within chassis and stacked within slots provided by racks. A data center may include large numbers of such racks that may be organized into rows in a manner that allows administrators to access components of the IHSs via the front and the back of a rack. In some instances, administrators may be able to service and replace components of a rack-mounted IHS while the IHS remains operational and installed within the rack. Such replaceable components may be referred to as being hot-pluggable. An administrator may also be able to re-configure aspects of the operation of a rack-mounted IHS through the coupling and de-coupling of cables to the various connectors that may be provided on the back of a chassis or by a rear-facing chassis component. In some instances, administrators may remove an IHS from operation in order to service or replace some of its internal components. In all such cases, it is preferable that administrators be able to access and service an IHS as easily and as safely as possible within the constraints of a server IHS being installed within a rack of a densely packed data center.

In many instances, rack systems are constructed according to standardized dimensions that define vertical and horizontal dimensions for components, such as chassis housing one or more server IHSs, that are installed within such racks. Standardized rack dimensions specify vertical units of space within a rack, where such vertical units of rack space are commonly referred to as RUs (Rack Units). In some instances, a chassis may be one rack unit (1RU) in height and may house a single IHS. In other instances, a chassis be multiple rack units in height and the chassis may include multiple IHSs. For example, a 2RU chassis may include a set of front bays that receive replaceable storage drives and may house two server IHSs that are each 1RU in height. In such instances, each of the 1RU IHSs may be separately administered and may themselves be replaceable components that may be coupled and de-coupled from a chassis.

SUMMARY

In various embodiments, a chassis houses one or more Information Handling Systems (IHSs). The chassis may include: a control layer, comprising: a power supply for use by components installed in the control layer of the chassis and for use by components installed in a processing layer of the chassis, a motherboard comprising one or more CPUs (Central Processing Units), wherein the CPUs are coupled to the processing layer via a PCIe fabric; and the processing layer, comprising: one or more I/O modules installed in a front compartment of the processing layer, wherein the I/O modules are replaceable via the front of the processing layer, a hardware accelerator sled installed in a central compartment of the processing layer, wherein the hardware accelerator sled is replaceable via a rear of the processing layer, and a block of cooling fans installed in a rear compartment of the processing layer, wherein the block of cooling fans provide airflow cooling to the I/O modules installed in the front compartment of the processing layer and to the hardware accelerator sled installed in the central compartment of the processing layer.

In some chassis embodiments, a height of the control layer is 2 RU (Rack Units). In some chassis embodiments, a height of the processing layer is 4 RU. In some chassis embodiments, a height of the chassis is 6 RU. In some chassis embodiments, the control layer further comprises a plurality of motherboard fans providing cooling in the control layer. In some chassis embodiments, the one or more I/O modules replaceable via the front compartment of the processing layer comprise a plurality of network controllers. In some chassis embodiments, the one or more I/O modules replaceable via the front compartment of the processing layer comprise a plurality of PCIe switches, wherein the PCIe switches provide the PCIe fabric coupling the CPUs of the motherboard to the processing layer. In some chassis embodiments, the hardware accelerator sled comprises a plurality of GPU (Graphics Processing Unit) cards. In some chassis embodiments, the hardware accelerator sled comprises a plurality of DPU (Data Processing Unit) cards. In some chassis embodiments, the hardware accelerator sled comprises a handle used for pulling the hardware accelerator sled from the center compartment of the chassis. In some chassis embodiments, the handle is rotated upwards to a stored position upon insertion of the hardware accelerator sled into the center compartment of the processing layer of the chassis and coupling the hardware accelerator sled to the I/O module. In some chassis embodiments, the handle is rotated downwards in order to decouple the hardware accelerator sled from the I/O module and to pull the hardware accelerator sled from within the center compartment of the processing layer of the chassis. In some chassis embodiments, when the handle is rotated upwards to a stored position, the block of cooling fans is installed directly against the hardware accelerator sled within the processing layer of the chassis. In some chassis embodiments, when the handle is rotated upwards to a stored position and the block of cooling fans is installed directly against the hardware accelerator sled, the handle of the hardware accelerator sled is nested within a cavity of the block of cooling fans.

In various additional embodiments, Information Handling Systems (IHSs) housed within a 6 RU (Rack Unit) chassis may include: a power supply installed within a 2 RU control layer of the chassis and supplying power for use by components installed in the control layer of the chassis and power for use by components installed in a 4 RU processing layer of the chassis; a motherboard installed within the 2 RU control layer of the chassis, wherein the motherboard comprises one or more CPUs (Central Processing Units), and wherein the CPUs are coupled to components in the processing layer of the chassis via a PCIe fabric; one or more I/O modules installed in a front compartment of the 4 RU processing layer of the chassis, wherein the I/O modules are replaceable via the front of the processing layer; a hardware accelerator sled installed in a central compartment of the 4 RU processing layer of the chassis, wherein the hardware accelerator sled is replaceable via a rear of the processing layer; and a block of cooling fans installed in a rear compartment of the 4 RU processing layer of the chassis, wherein the block of cooling fans provide airflow cooling to the I/O modules installed in the front compartment of the processing layer and to the hardware accelerator sled installed in the central compartment of the processing layer.

In some IHS embodiments, the hardware accelerator sled comprises a plurality of GPU (Graphics Processing Unit) cards. In some IHS embodiments, the hardware accelerator sled comprises a handle used for pulling the hardware accelerator sled from the center compartment of the chassis.

In various additional embodiments, systems may include: a 2 RU (Rack Unit) control layer of a 6 RU chassis, the control layer comprising: a power supply for use by components installed in the control layer of the chassis and for use by components installed in a processing layer of the chassis, a motherboard comprising one or more CPUs (Central Processing Units), wherein the CPUs are coupled to the processing layer via a PCIe fabric; and the 2 RU processing layer of the 6 RU chassis, the processing layer comprising: one or more I/O modules installed in a front compartment of the processing layer, wherein the I/O modules are replaceable via the front of the processing layer of the chassis; a hardware accelerator sled installed in a central compartment of the processing layer, wherein the hardware accelerator sled is replaceable via a rear of the processing layer of the chassis; and a block of cooling fans installed in a rear compartment of the processing layer, wherein the block of cooling fans provide airflow cooling to the I/O modules installed in the front compartment of the processing layer and to the hardware accelerator sled installed in the central compartment of the processing layer of this chassis.

In some system embodiments, the hardware accelerator sled comprises a plurality of GPU (Graphics Processing Unit) cards. In some system embodiments, the hardware accelerator sled comprises a handle used for pulling the hardware accelerator sled from the center compartment of the chassis.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

As described, in a data center environment, an IHS may be installed within a chassis, in some cases along with other similar IHSs, such as other server IHSs. A rack may house multiple such chassis and a data center may house numerous racks. Each rack may host a relatively large number of IHSs that are installed as components of chassis, with multiple chassis stacked and installed within each rack. In certain instances, the front-side of such rack-mounted chassis may include one or more bays that each receive an individual replaceable component, such as a storage drive or a computing node. In some instances, these components may be removeable components that may be inserted and extracted from rear-facing bays of the chassis. In some cases, these components may be hot-swappable components that may be removed and replaced by administrators while at least a portion of the IHS remains operational. Some rack-mounted chassis may be multiple rack units in height and may house multiple IHSs. For example, an IHS may be housed within a 2RU (2 Rack Units) chassis that houses two levels of 1RU components.

In such data center environments, reducing the vertical height of a chassis can significantly impact the density of components that can be supported within a rack, and thus throughout the data center. For instance, existing systems support chassis configurations that include multiple replaceable hardware accelerators, such as graphics processing units, for use in high-performance computing applications, but cooling requirements for such existing configurations results in these chassis requiring at least 8 RUs of space with a rack. Embodiments provide high-density chassis that provide support for replaceable hardware accelerator units, where the chassis fits within 6 RU rack space and that still provides sufficient cooling to support the demands of high-performance computing.

Figure 1:
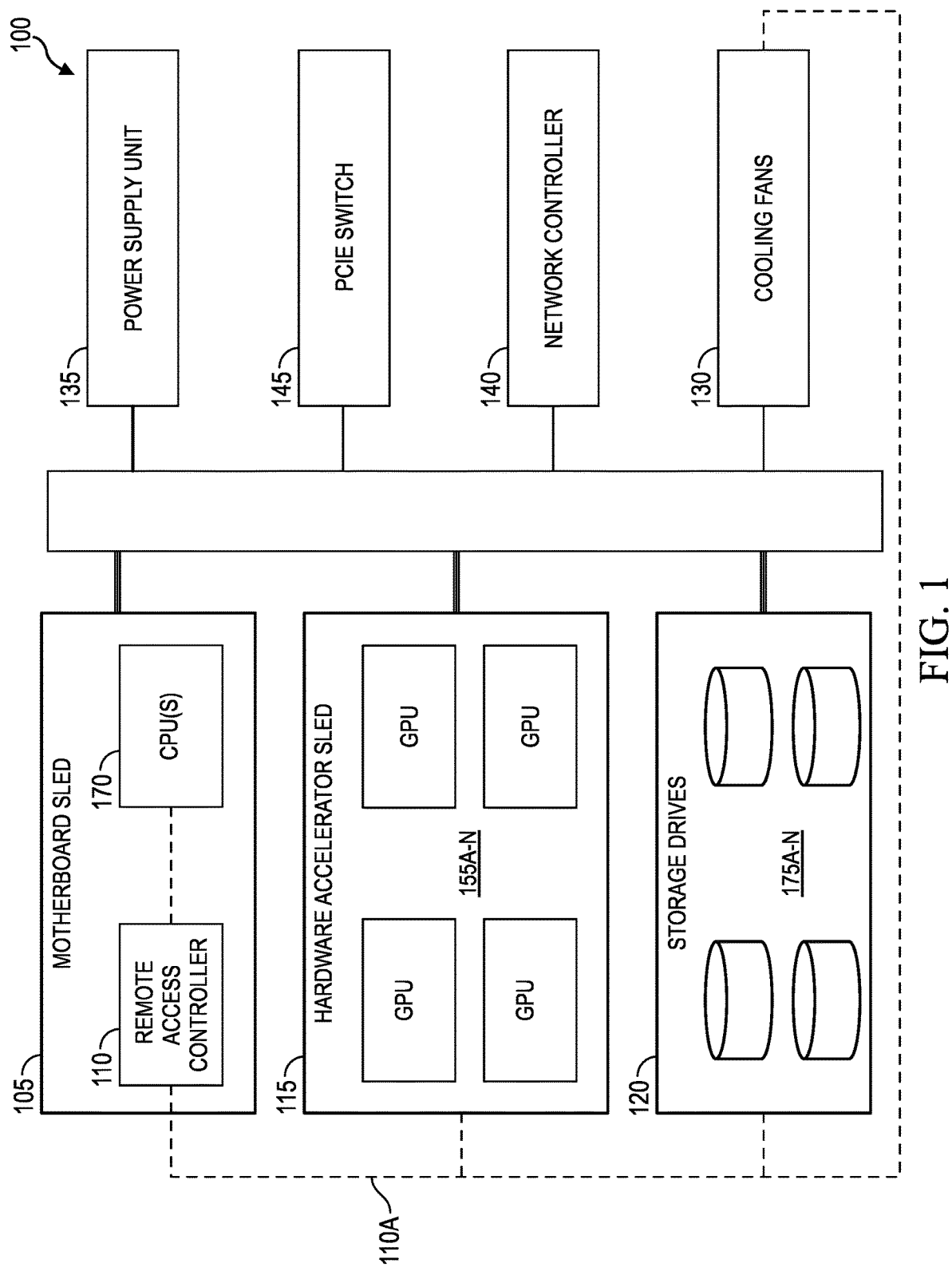
FIG. 1 is a diagram illustrating certain components of a high-density chassis configured, according to some embodiments, for supporting replaceable hardware accelerators with the chassis.

FIG. 1 is a block diagram illustrating certain electrical components and connections of a high-density chassis 100 comprising a motherboard sled 105, a storage sled 120, where the chassis supports a replaceable hardware accelerator sled 115. Embodiments of chassis 100 may include a wide variety of hardware configurations. Such variations in hardware configuration may result from chassis 100 being factory assembled to include components specified by a customer that has contracted for manufacture and delivery of chassis 100. Upon delivery and deployment of a chassis 100, the chassis 100 may be modified by replacing and/or adding various hardware components, in addition to replacement of the removeable IHSs components installed in the chassis.

Chassis 100 may include one or more bays that each receive an individual sled (that may be additionally or alternatively referred to as a tray, blade, and/or node), such as motherboard sled 105 and hardware accelerator sled 115. Chassis 100 may support a variety of different numbers (e.g., 4, 8, 16, 32), sizes (e.g., single-width, double-width) and physical configurations of bays. Embodiments may include additional types of sleds that provide various storage, power and/or processing capabilities. For instance, sleds installable in chassis 100 may be dedicated to providing power management or networking functions. Sleds may be individually installed and removed from the chassis 100, thus allowing the computing and storage capabilities of a chassis to be reconfigured by swapping the sleds with different types of sleds, in some cases at runtime without disrupting the ongoing operations of the other sleds installed in the chassis 100. The sleds may be individually coupled to chassis 100 via connectors that correspond to the bays provided by the chassis 100 and that physically and electrically couple the sleds to motherboard sled 105 and/or to one another.

Multiple chassis 100 may be housed within a rack. Data centers may utilize large numbers of racks, with various different types of chassis installed in various configurations of racks. The modular architecture provided by the sleds, chassis and racks allow for certain resources, such as cooling, power and network bandwidth, to be shared by the sleds installed in chassis 100, thus providing efficiency improvements and supporting greater computational loads.

Chassis 100 may be installed within a rack structure that provides a portion of the cooling utilized by the sleds installed in chassis 100. For airflow cooling, a rack may include one or more banks of cooling fans that may be operated to ventilate heated air from within the chassis 100 that is housed within the rack. As described in additional detail below, chassis 100 may alternatively or additionally include a bank of cooling fans 130 that may be similarly operated to ventilate heated air out of the chassis and away from the sleds installed within chassis. In this manner, a rack and a chassis 100 installed within the rack may utilize various configurations and combinations of cooling fans to cool the sleds and other components housed within chassis 100.

As described in additional detail below, motherboard sled 105 may implemented in embodiments such that it may be installed within a 2 RU bay of chassis 100, thus supporting a high-density configuration of chassis 100 where a hardware accelerator sled 115 may be installed within a 6 RU bay of chassis 100. Motherboard sled 105 may include be a printed circuit board (i.e., motherboard) that includes electrical traces and connectors that are configured to route signals between the various components of chassis 100 that are connected to the motherboard sled 105 and between different components mounted on the motherboard. As illustrated, motherboard sled 105 may include one or more CPU(s) used to execute software programs that include an operating system and that may also include various programs for utilizing and managing the capabilities provided by chassis 100, and in particular by hardware accelerator sled 115.

Figure 2:
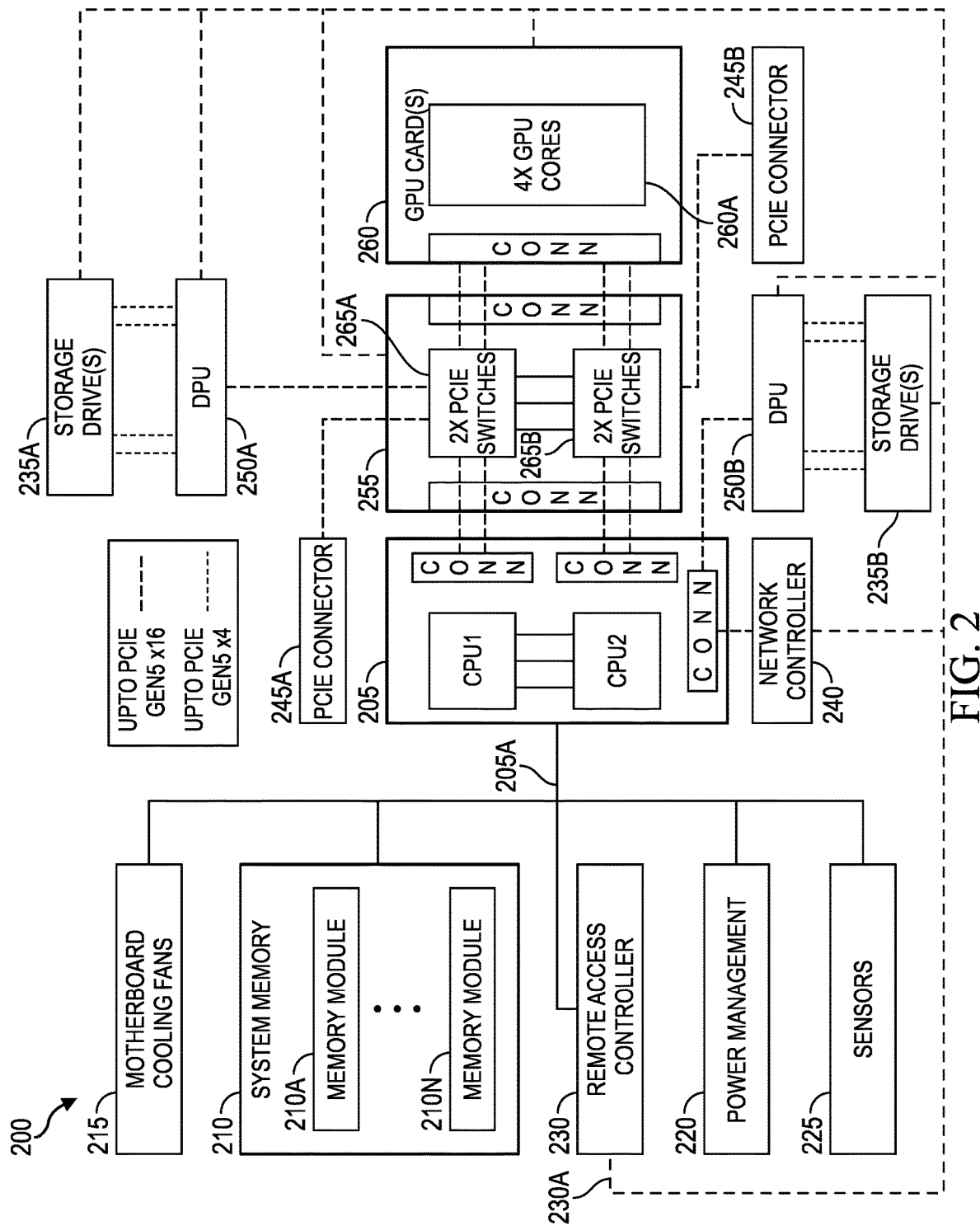
FIG. 2 is a diagram illustrating certain components of an IHS configured for installation in a high-density chassis, according to some embodiments, that supports replaceable hardware accelerators.

In some embodiments, motherboard sled 105 may be an IHS such as described with regard to IHS 200 of FIG. 2. Accordingly, motherboard sled 105 may include a variety of processing and data storage components, including various system memories. Utilizing these capabilities, motherboard sled 105 may implement a variety of management and security operations for the components of chassis 100. Motherboard sled 105 may also include various I/O controllers that may support various I/O ports, such as USB ports that may be used to support keyboard and mouse inputs and/or video display capabilities. Such I/O controllers may be utilized to support various KVM (Keyboard, Video and Mouse) capabilities that provide administrators with the ability to interface with the chassis 100. Motherboard sled 105 may support various additional functions for use of resources of chassis 100, such as for the use of computational resources provided by hardware accelerator sled 115. In some scenarios, motherboard sled 105 may implement tools for managing various other resources available via chassis 100, such as power outputs of power supply unit 135, the network bandwidth provided by network controller 140 and/or PCIe switch 145, and the airflow cooling provided by cooling fans 130.

Motherboard sled 105 may be coupled to components of chassis 100 via a PCIe switch fabric. In some embodiment, the connectors for use in coupling motherboard sled 105 to a PCIe switch 145 include PCIe couplings that support configurable, high-speed data links, where these PCIe links may connect hardware accelerator sled 115 to hardware accelerator sled 115 and storage drives 120. As described in additional detail below, motherboard sled 105 may be connected to a PCIe switch fabric that is implemented using a PCIe switch 145 that is part of an I/O module installed within chassis 100, and in particular that is installed with a front compartment of a processing layer installed within a 4 RU bay chassis 100.

As illustrated, motherboard sled 105 includes a remote access controller (RAC) 110. As described in additional detail with regard to FIG. 2, remote access controller 110 provides capabilities for remote monitoring and management of the components installed in chassis 100. In support of these monitoring and management functions, remote access controllers 110 may utilize both in-band and sideband (i.e., out-of-band) 110a communications with various components of chassis 100. Remote access controllers 110 may collect various types of sensor data, such as collecting temperature sensor readings that are used in support of airflow cooling of the chassis 100 and of the motherboard sled 105. In addition, remote access controller 110 may implement various monitoring and administrative functions related to motherboard sled 105 that utilize sideband bus connections with various internal components of the motherboard sled 105.

Chassis 100 also includes a replaceable hardware accelerator sled 115 that includes one or more processing cores that may be used for delegating a variety of processing tasks, where such delegation may be through programs operating on motherboard sled 105, or via remote systems that interface with the hardware accelerator sled 115 via connections supported by network controller 140. In some embodiments, the processing cores may include multiple GPUs (Graphics Processing Units) 155a-n that may be configured for use in high-performance computing applications. In some embodiments, hardware accelerator sled 115 may include one or more accelerator cards, where each accelerator card may itself include one or more accelerator cores. Accordingly, GPUs 155a-n may each be GPU baseboard cards that include multiple GPU cores. In some embodiments, some or all of the accelerator cores available in hardware accelerator sled 115 may be programmable processing cores that can be configured for offloading specific computational functions to the hardware accelerator sled 115.

Hardware accelerator sled 115 may be configured for general-purpose computing or may be optimized for specific computing tasks, such as for implementing machine learning or other artificial intelligence systems. In various embodiments, hardware accelerator sled 115 provides high-performance, computational processing resources that may be used to support a variety of e-commerce, multimedia, entertainment, business and scientific computing applications. Accordingly, hardware accelerator sled 115 may be typically configured with hardware and software that provide leading-edge computational capabilities. Accordingly, services provided using such computing capabilities are typically provided as high-availability systems that operate with minimum downtime. As such, embodiments support efficient administration of chassis 100 and in particular support efficient replacement of hardware accelerators installed in chassis 100, as described in additional detail below As illustrated, chassis 100 also includes one or more storage drives 120 that may be attached to chassis and coupled to connectors supported by components of chassis 200, such as PCIe switch 145. For instance, storage drives 120 may include multiple solid-state drives (SSDs) 175a-n that are accessed by components of chassis 100 via PCIe switch 145, thus providing low-latency and high-bandwidth access to the SSDs. In addition to the data storage capabilities provided by storage drives 120, chassis 100 may provide access to other storage resources that may be installed as components of chassis 100 and/or may be installed elsewhere within a rack housing the chassis 100, such as within a storage blade to which chassis 100 is coupled. In certain scenarios, such storage resources may be accessed via a SAS expander that is implemented by the motherboard sled 105. The SAS expander may support connections to a number of JBOD (Just a Bunch Of Disks) storage drives 120 that may be configured and managed individually and without implementing data redundancy across the various drives. The additional storage resources may also be at various other locations within a datacenter in which chassis 100 is installed.

As described, the chassis 100 of FIG. 1 includes a network controller 140 that provides network access to the motherboard sled 105 and hardware accelerator sled 115 installed within the chassis. Network controller 140 may include various switches, adapters, controllers and couplings used to connect chassis 100 to a network, either directly or via additional networking components and connections provided via a rack in which chassis 100 is installed, such as by a network switch installed in the chassis. As described in additional detail below, network controller 100 may be integrated along with PCIe switch 145 within a replaceable I/O module that may be installed within a 4 RU bay of chassis 100, and in particular within a front compartment of a processing layer of components installed in that bay of chassis 100.

Chassis 100 also includes a power supply unit 135 that provides the components of the chassis with various levels of DC power from an AC power source or from power delivered via a power system provided by a rack within which chassis 100 may be installed. In certain embodiments, power supply unit 135 may be implemented within one or more sleds that provide chassis 100 with redundant, hot-swappable power supply units. As described in additional detail below, power supply unit 135 may be a sled that installed within a 2 RU bay of chassis 100, and in particular within a rear compartment of a control layer of components installed in that bay of chassis 100.

As illustrated, chassis 100 includes cooling fans 130 that are utilized in the airflow cooling of the components installed in chassis 100. As described in additional detail below, cooling fans may include a replaceable bank of cooling fans that may be installed within a 4 RU bay of chassis 100, and in particular with a rear compartment of a processing layer of components installed in that bay of chassis 100. Installed in the manner the bank of cooling fans 130 provide cooling for the components installed within this 4 RU processing layer of chassis 100, and thus for the hardware accelerator sled 115. Inventors have recognized that the significant cooling requirements for hardware accelerator sled 115 may be met while utilizing a 4 RU bank of cooling fans 130 that is installed directly adjacent to the hardware accelerator sled 115. These cooling requirements may be further met by locating the power supply unit 135 and motherboard sled 105 within a separately-cooled bay of chassis 100 from the 4 RU processing layer in which the hardware accelerator sled 115 is installed.

FIG. 2 illustrates an example of an IHS 200, according to some embodiments, configured for installation in a high-density chassis that supports replaceable hardware accelerators. It should be appreciated that although the embodiments described herein may describe an IHS that is implemented using a motherboard sled 105 coupled to other components, such as hardware accelerator sled 115, that are deployed within the bays of a chassis, a variety of other types of IHSs may be implemented according to the embodiments described herein. In the illustrative embodiment of FIG. 2, IHS 200 may include a motherboard sled 105 installed in a 2 RU bay of a chassis 100, as well as components of a processing layer installed within a 4 RU bay the chassis 100. Once installed in the 6 RU chassis and coupled to each other, the electrical components of chassis 100 may be considered an IHS 200.

Accordingly, IHS 200 may utilize one or more system processors 205, that may be referred to as CPUs (central processing units), that are components of a motherboard sled 105. In some embodiments, CPUs 205 may each include a plurality of processing cores that may be separately assigned computing tasks. Each of the CPUs 205 may be individually designated as a main processor and as a co-processor, where such designations may be based on delegation of specific types of computational tasks to a CPU 205. In some embodiments, CPUs 205 may each include an integrated memory controller that may be implemented directly within the circuitry of each CPU 205. In some embodiments, a memory controller may be a separate integrated that is located on the same die as the CPU 205. Each memory controller may be configured to manage the transfer of data to and from a system memory 210 of the IHS, in some cases using a high-speed memory interface. The system memory 210 is coupled to CPUs 205 via one or more memory buses that provide the CPUs 205 with high-speed memory used in the execution of computer program instructions by the CPUs 205. Accordingly, system memory 210 may include memory components, such as static RAM (SRAM), dynamic RAM (DRAM), NAND Flash memory, suitable for supporting high-speed memory operations by the CPUs 205. In certain embodiments, system memory 210 may combine persistent non-volatile memory and volatile memory.

In certain embodiments, the system memory 210 may be comprised of multiple removable memory modules. The system memory 210 of the illustrated embodiment includes removable memory modules 210a-n. Each of the removable memory modules 210a-n may correspond to a printed circuit board memory socket of a motherboard sled 105 that receives a removable memory module 210a-n, such as a DIMM (Dual In-line Memory Module), that can be coupled to the socket and then decoupled from the socket as needed, such as to upgrade memory capabilities or to replace faulty memory modules. Other embodiments of IHS system memory 210 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

IHS 200 may utilize a chipset that may be implemented by integrated circuits that are connected to each CPU 205. All or portions of the chipset may be implemented directly within the integrated circuitry of an individual CPU 205. The chipset may provide the CPU 205 with access to a variety of resources accessible via one or more in-band buses 205a. IHS 200 may also include one or more I/O ports that may be used to couple the IHS 200 directly to other IHSs, storage resources, diagnostic tools, and/or other peripheral components. A variety of additional components may be coupled to CPUs 205 via a variety of busses. For instance, CPUs 205 may also be coupled to a power management unit 220 that may interface with a power system of the chassis 100 in which IHS 200 may be installed. CPUs 205 may collect information from one or more sensors 225 via a management bus.

In certain embodiments, IHS 200 may operate using a BIOS (Basic Input/Output System) that may be stored in a non-volatile memory accessible by the CPUs 205. The BIOS may provide an abstraction layer by which the operating system of the IHS 200 interfaces with hardware components of the IHS. Upon powering or restarting IHS 200, CPUs 205 may utilize BIOS instructions to initialize and test hardware components coupled to the IHS, including both components permanently installed as components of the motherboard of IHS 200 and removable components installed within various expansion slots supported by the IHS 200. The BIOS instructions may also load an operating system for execution by CPUs 205. In certain embodiments, IHS 200 may utilize Unified Extensible Firmware Interface (UEFI) in addition to or instead of a BIOS. In certain embodiments, the functions provided by a BIOS may be implemented, in full or in part, by the remote access controller 230.

In some embodiments, IHS 200 may include a TPM (Trusted Platform Module) that may include various registers, such as platform configuration registers, and a secure storage, such as an NVRAM (Non-Volatile Random-Access Memory). The TPM may also include a cryptographic processor that supports various cryptographic capabilities. In IHS embodiments that include a TPM, a pre-boot process implemented by the TPM may utilize its cryptographic capabilities to calculate hash values that are based on software and/or firmware instructions utilized by certain core components of IHS, such as the BIOS and boot loader of IHS 200. These calculated hash values may then be compared against reference hash values that were previously stored in a secure non-volatile memory of the IHS, such as during factory provisioning of IHS 200. In this manner, a TPM may establish a root of trust that includes core components of IHS 200 that are validated as operating using instructions that originate from a trusted source.

As illustrated, CPUs 205 may be coupled to a network controller 240, such as provided by a Network Interface Controller (NIC) card that provides IHS 200 with communications via one or more external networks, such as the Internet, a LAN, or a WAN. In some embodiments, network controller 240 may be a replaceable expansion card or adapter of a motherboard sled 105 of IHS 200. In some embodiments, network controller 240 may be support network operations by CPUs 205 through a PCIe coupling accessible by the chipsets of CPUs 205. As described in additional detail below, network controller 240 may an integrated component of an I/O module that is located within the processing layer of the chassis and that also includes a PCIe switch 255. In such embodiments, integration of PCIe and networking capabilities of network controller 240 within this I/O module supports high-bandwidth PCIe network operations by one or more replaceable hardware accelerators, such as GPU baseboards 260 and DPU baseboards 250a-b, that are installed within a central compartment of the processing layer of the chassis in which IHS 100 is installed.

As indicated in FIG. 2, in some embodiments, CPUs 205 may be coupled to a PCIe card 255 that includes two pairs of PCIe switches 265a-b (i.e., four distinct PCIe switches) that operate as I/O controllers for PCIe communications, such as TLPs (Transaction Layer Packets), that are transmitted between the CPUs 205 and PCIe devices and systems coupled to IHS 200. In some embodiments, each of the two pairs of PCIe switches 265a-b may be connected to the IHS via a removeable card 255 that couples to a PCIe connector of the IHS. As described in additional detail below, embodiments may locate this PCIe card 255 within an I/O module that is installed in a front compartment of a 4 RU processing layer of the chassis in which IHS 200 is installed. Whereas the illustrated embodiment of FIG. 2 includes two CPUs 205 and two pairs of PCIe switches 265a-b, different embodiments may operate using different numbers of CPUs and PCIe switches. In addition to serving as I/O controllers that route PCIe traffic, the pairs of PCIe switches 265a-b include switching logic that can be used to expand the number of PCIe connections that are supported by CPUs 205. Accordingly, the pairs of PCIe switches 265a-b may multiply the number of PCIe lanes available to CPUs 205, thus allowing more PCIe devices to be connected to CPUs 205, and for the available PCIe bandwidth to be allocated with greater granularity.

As illustrated, PCIe switches 265a are coupled via PCIe connections to one or more GPUs (Graphics Processing Units) cores 260a that serve as hardware accelerators and that may be a connected to the IHS via one or more removeable GPU cards 260 that couple to PCIe connectors of the IHS. Embodiments may include one or more GPU cards 260, where each GPU card is coupled to one or more of the PCIe switches 265a-b, and where each GPU card 260 may include one or more GPU cores 260a. Each of the GPU cores 260a may be a programmable processing core and/or hardware accelerator that can be configured for offloading certain functions from CPUs 205. For instance, PCIe switches 265a-b may transfer instructions and data for generating video images between one or more GPU cores 260a and CPUs 205. In processing this graphics data, GPU cores 260a may include hardware-accelerated processing cores that are optimized for performing streaming calculation of vector data, matrix data and/or other graphics data, thus supporting the rendering of graphics for display on devices coupled either directly or indirectly to IHS 200.

Rather than being used for rendering graphics data for display, GPU cores 260a may instead be used in hardware-accelerated processing of graphics data for other purposes, such as in support of artificial intelligence and machine learning systems. For instance, GPU cores 260a may be used in processing graphical inputs from video and/or camera feeds being utilized in support of machine vision systems. In some instances, GPU cores 260a may process streaming video data in support of on-the-fly machine vision evaluation of live captured video, where captured video data and data resulting from the processing of the video data by the GPU cores 260a may be stored by DPUs 250a-b to SSD storage drives 235a-b via PCIe lanes implemented by PCIe switches 265a-b. In other instances, GPU cores 260a may be utilized in offline processing of video data, such as for training of machine learning systems. In such instances, the video data may be retrieved by DPUs 250a-b from SSD storage drives 235a-b and transmitted to GPU cores 260a for processing, also via PCIe lanes implemented by PCIe switches 265a-b. Embodiments may additionally or alternatively used in the offloading and acceleration of various types of computational workloads other than in the processing of video data, such as signal processing algorithms used in processing of speech data.

As described in additional detail below, the one or more GPU cards 260 are installed in IHS 200, such as within a hardware accelerator sled, that is installed within a central compartment of a 4 RU processing layer of a chassis 100. In supporting offloading functions, such as the described processing of video data, GPU cores 260a may generate substantial amounts of heat. Accordingly, substantial cooling resources are required to support simultaneous, high-performance operation of all of the GPU cards 260 that may be installed within the central compartment of the processing layer of chassis 100. Embodiments support sufficient cooling of this central compartment in the processing layer of the chassis 100, while also supporting replacement of the GPU cards 260 by data center administrators, thus allowing the computing capabilities of IHS 200 to be adapted for different computing tasks.

As illustrated, PCIe switch 265a is coupled via PCIe connections to a DPU 250a that may provide hardware-accelerated computing in IHS 100 through a removeable card that couples DPU 250a to a PCIe connector of the IHS. Also as illustrated, rather than utilize a PCIe switch, DPU 250b is coupled via a PCIe connection directly to CPUs 205, but may similarly provide hardware-accelerated computing in IHS 100. Each of the DPUs 250a-b includes a programmable processor that can be configured for offloading functions from CPUs 205. In some embodiments, DPUs 250a-b may be programmed to process offloaded computations, thus sparing CPUs 205 from a significant number of interrupts required to support such algorithms and gaining efficiency through the use of specialized implementations of these offloaded PCB design computations that can be achieved using the programmable logic of the DPUs 250a-b.

In some embodiments, DPUs 250a-b may include a plurality of programmable processing cores and/or hardware accelerators, that may be used to implement functions used to support devices coupled to the IHS 200. In the illustrated embodiment, DPUs 250a-b implement functions used to support storage drives 235a-b, such as SSDs (solid-state drives). For instance, DPUs 250a-b may implement processing of PCIe communications with SSD storage drives 235a-b that support NVMe protocols that support the use of high-bandwidth PCIe connections with SSDs. In other embodiments, DPUs 250a-b may implement operations in support of other types of devices and may similarly support high-bandwidth PCIe connections with these devices. For instance, in various embodiments, DPUs 250a-b may support high-bandwidth connections, such as PCIe connections, with networking devices in implementing functions of a network switch, compression and codec functions, virtualization operations or cryptographic functions.

In the same manner as GPU cards 260, in some embodiments, each of the cards on which DPUs 250a-b are mounted may be installed within a hardware accelerator sled that is located within a central compartment of a 4 RU processing layer of a chassis 100. As with the GPU cores 260a, DPUs 250a-b may generate significant amounts of heat in supporting high-performance computing. As for GPU cards 260, embodiments support sufficient cooling of this central compartment in the processing layer of the chassis 100, while also supporting replacement of the DPU cards by data center administrators, thus allowing the computing capabilities of IHS 200 to be adapted for different computing tasks.

As described, IHS 200 may include a remote access controller 230 that supports remote management of IHS 200 and of various internal components of IHS 200. In certain embodiments, remote access controller 230 may operate from a different power plane from the CPUs 205 and from other components of IHS 200, thus allowing the remote access controller 230 to operate, and management tasks to proceed, while the processing cores of IHS 200 are powered off. As described, various functions provided by the BIOS, including launching the operating system of the IHS 200, may be implemented by the remote access controller 230. In some embodiments, the remote access controller 230 may perform various functions to verify the integrity of the IHS 200 and its hardware components prior to initialization of the operating system of IHS 200 (i.e., in a bare-metal state).

Remote access controller 230 may include a service processor, or specialized microcontroller, that operates management software that provides remote monitoring and administration of IHS 200. Remote access controller 230 may be installed on the motherboard, backplane, midplane, etc. of IHS 200, or may be coupled to IHS 200 via an expansion slot connector provided the IHS. In support of remote monitoring functions, remote access controller 230 may include a dedicated network adapter that may support management connections by remote access controller 230 using wired and/or wireless network technologies. As a non-limiting example of a remote access controller, the integrated Dell Remote Access Controller (iDRAC) from Dell® is embedded within Dell PowerEdge™ servers and provides functionality that helps information technology (IT) administrators deploy, update, monitor, and maintain servers remotely.

In some embodiments, remote access controller 230 may support monitoring and administration of various managed devices of an IHS via a sideband bus interface 230a. For instance, messages utilized in device management may be transmitted using I2C sideband bus 230a connections that may be established with each of the managed devices. These managed devices of IHS 200, such as specialized hardware, network controller(s) 240, DPUs 250a-b, GPUs 260, and storage drives 235a-b, may be connected to the CPUs 205 via in-line buses, such as the described PCIe switch fabric, that is separate from the I2C sideband bus 230a connections used by the remote access controller 230 for device management. As described in additional detail with regard to FIG. 3, in some embodiments, remote access controller 230 may be installed in a 2 RU control sled and may utilize this sideband bus 230a in identifying characteristics of a 4 RU hardware accelerator sled that shares the same 6 RU chassis with the control sled.

As described, a hardware accelerator sled may include multiple replaceable GPU boards 260 and/or DPU boards that may be added and removed from the hardware accelerator sled. In support of this capability, remote access controller 230 may be configured to interface with GPU cards 260 and/or DPUs 250a-b in identifying the replaceable computing components installed within the hardware accelerator sled 115. Based on this collected information, remote access controller 230 may adjust the parameters utilized by the block of cooling fans installed in the processing layer of the chassis in which IHS 200 is located. In some embodiments, remote access controller 230 may utilize sideband management connections in identifying the managed GPU cards 260 and/or DPUs 250a-b installed in the hardware accelerator sled that is installed in the central compartment of the processing layer of the chassis.

As indicated FIG. 2, IHS 200 includes a motherboard cooling fans 215. As described in additional detail below, the cooling capabilities provided by the block of cooling fans is dedicated for use by the cooling the components of the processing layer, especially hardware accelerator sled 115. As such, IHS 100 includes motherboard cooling fans 215 for use in providing airflow cooling to the control layer of the chassis, and in particular to the motherboard sled 105 and power supply units installed in the 2 RU control layer of the chassis. Through such allocation of airflow cooling resources within the described arrangement of chassis components, inventors have recognized that sufficient cooling is available to support high-performance computing implementations using the replaceable hardware accelerator sleds.

As illustrated in FIG. 2, PCIe switches 265a-b may support PCIe connections in addition to those utilized by GPUs 260 and DPUs 250a-b, where these connections may include PCIe links of one or more lanes. For instance, PCIe connectors 245a-b supported by a motherboard sled 105 of IHS 200 may allow various other systems and devices to be coupled to IHS. Through couplings to PCIe connectors 245a-b, a variety of data storage devices, graphics processors and network interface cards may be coupled to IHS 200.

In various embodiments, an IHS 200 does not include each of the components shown in FIG. 2. In various embodiments, an IHS 200 may include various additional components in addition to those that are shown in FIG. 2. Furthermore, some components that are represented as separate components in FIG. 2 may in certain embodiments instead be integrated with other components. For example, in certain embodiments, all or a portion of the functionality provided by the illustrated components may instead be provided by components integrated into the one or more processor(s) 205 as a systems-on-a-chip.

Figure 3:
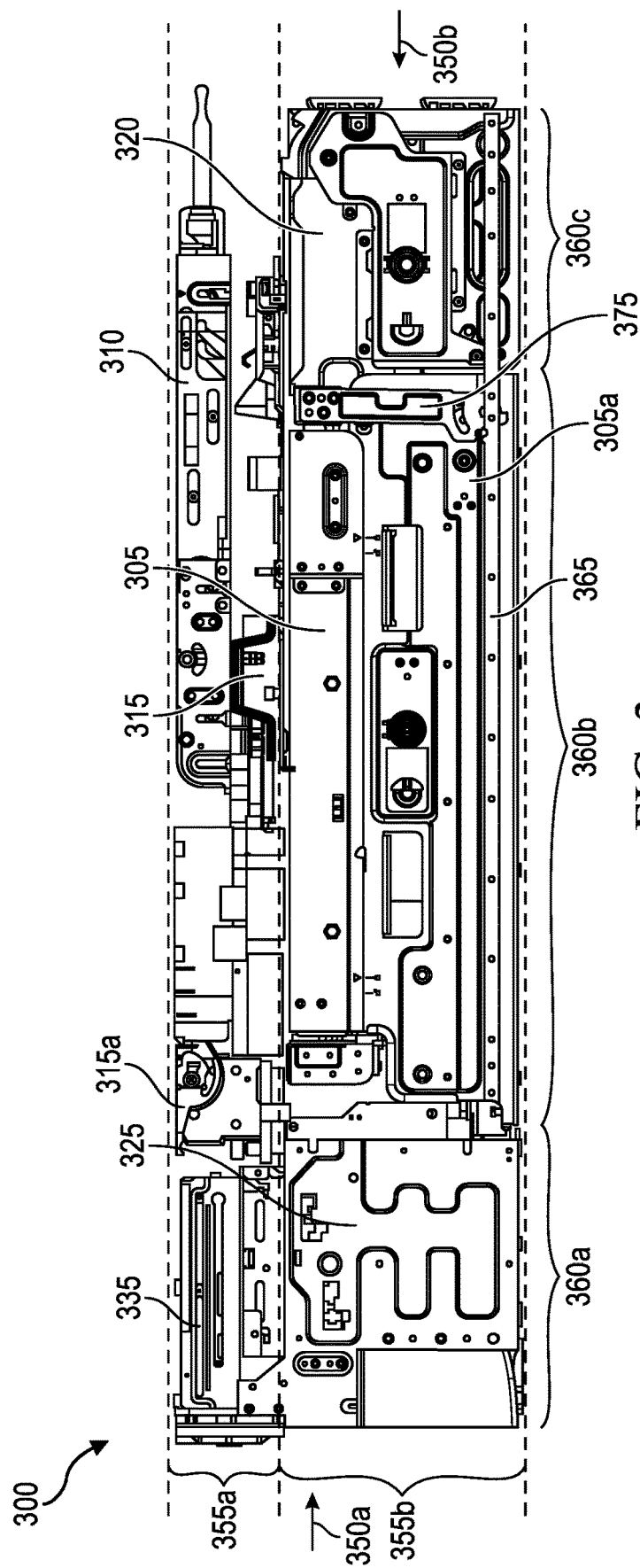
FIG. 3 is a cutaway sideview illustration of a chassis, according to embodiments, that supports replaceable hardware accelerators.

FIG. 3 is a cutaway sideview illustration of the arrangement of components within a chassis 300, according to embodiments, that supports replaceable hardware accelerators. In the illustrated embodiment, components installed in the chassis 300 may be serviced, added or replaced by a data center administrator via the front 350a side of the chassis, and via the rear 350b side of the chassis. In some instances, components installed in the chassis 300 may be accessed without removing the chassis from within the rack in which the chassis is installed. In other instances, the chassis 300 may be removed from the rack in order to access certain internal components of the chassis. However, embodiments support the ability for an administrator to replace a hardware accelerator sled 305 that is installed within a central compartment 360b of the chassis 300, without the administrator having to remove the chassis 300 from within the rack in which the chassis is installed.

As indicated in FIG. 3, the chassis 300 is physically divided into two separate layers. A first layer is a control layer 355a that includes a motherboard 315 that provides computing resources used in the command and control of chassis 300. The control layer 355a also includes a power supply 310 that serves as a power source for all of the components of chassis 300. The second layer is a processing layer 355b that includes a replaceable hardware accelerator sled 305 that is located in a central compartment 360b of the processing layer. In the illustrated embodiment, the control layer 355a is the top layer of chassis 300 and processing layer 355b is the bottom layer of chassis 300. In other embodiments, the order of these two layers within chassis 300 may be reversed such that processing layer 355b is the top layer of chassis 300 and control layer 355a is the bottom layer of chassis 300.

Regardless of the ordering of the layers of chassis 300, the processing layer 355b has a height of 4 RU and the control layer 355a has a height of 2 RU, such that the height of chassis 300 is 6 RU. In existing solutions that support replaceable hardware accelerators withing a chassis, such as replaceable GPUs, chassis heights are at least 8 RU, where this height is selected in order to support cooling of the replaceable hardware accelerators. Embodiments, on the other hand, support replaceable installation of hardware accelerator sled 305 within a 6 RU chassis, thus promoting denser arrangements of chassis within a rack. For instance, in comparison to existing 8 RU configurations, use of the 6 RU chassis allows an entire additional chassis to be installed in every 24 RU of space within a rack. In other words, embodiments allow four high-density 6 RU chassis that each support a replaceable hardware accelerator sled 305 to be installed in 24 RU of rack space, while existing systems only support three 8 RU chassis in this same 24 RU of rack space. Accordingly, embodiments support a significant increase in density within a rack of a data center, where such density may be supported without requiring use of specialized cooling components, and while supporting efficient replacement of hardware accelerator sled 305 by administrators, thus minimizing downtime for chassis 300.

In supporting such high-density configurations that fit within 6 RUs, the 2 RU control layer 355a of chassis 300 includes the management and power capabilities of the chassis. In particular, the control layer 355a includes a motherboard 315 and one or power supply units 310. In some embodiments, motherboard 315 may be a component of a motherboard sled 105, such as described above, where this motherboard sled is inserted within the 2 RU processing layer 355b of chassis 300. Also include in the control layer 355a are one or more solid-state memory components 335 that may be used as storage class memories (SCMs) by motherboard 315. In some embodiments, motherboard 315 may also include a 2 RU motherboard fan 315a that provides airflow cooling to motherboard 315 and to the other components installed in the control layer 355a of chassis 300.

As described, the computing demands placed on hardware accelerator sled 305 may result in significant cooling requirements. Embodiments address these requirements though use of a 4 RU bank of cooling fans 320 that provides cooling to the processing layer 355b. In order for the 4 RU bank of cooling fans 320 to provide sufficient cooling to the processing layer 355b, embodiments provide separate cooling for the components of the control layer 355a. In particular, a motherboard fan 315a provides has been demonstrated by inventors to provide sufficient airflow cooling for all of the components of the 2 RU control layer 355a, in particular for the motherboard 315 and power supply units 310. As described, cooling of the 4 RU processing layer 355b is separately achieved by the bank of cooling fans 320 that inventors have demonstrated as being capable of sufficiently cooling the hardware accelerator sled 305 and the I/O module 325 of the processing layer 355b.

As described above, in some embodiments, the power supply units 310 may be replaceable components, such as a power supply sled, that may be inserted and removed by a data center administrator via the rear 350b of chassis 300. In some embodiments, power supply units 310 may be coupled to a power distribution board that may be a component of motherboard 315, or that may be a separate component installed within the control layer 355a between motherboard 315 and power supply 310. The power distribution board receives power inputs from the power supply units 310 and provides regulated power supplies to the components of the chassis, including the motherboard 315 in the control layer 355a of the chassis, as well as the components of the processing layer 355b of the chassis, including the I/O module 325, hardware accelerator sled 305 and cooling fans 320. Accordingly, the 2 RU power supply units 310 are the sole source of power for all components in the 6 RU chassis 300.

As described, processing layer 355b includes a replaceable hardware accelerator sled 305 that may include one or more hardware accelerators, such as the GPU cards and DPU cards described with regard to the IHS 200 of FIG. 2. In some embodiments, replaceable hardware accelerator sled 305 may include a PCB board with connectors, such as PCIe connectors, that receive PCB cards on which replaceable hardware accelerators are mounted. Once the hardware accelerator sled 305 has been removed from within the central compartment 360b of the processing layer 355b of the chassis 300, as described in additional detail below, individual replaceable hardware accelerator cards may be added and removed from the PCB board of the replaceable hardware accelerator sled 305.

The processors of the hardware accelerator sled 305 may be tasked by processes operating on a CPU of motherboard 315, or by processes operating on another chassis, that may or may not be within the same data center as chassis 300. In some instances, the processors of the replaceable hardware accelerator sled 305 may be utilized in machine learning and other artificial intelligence systems that are configured to distribute computing operations to available computing resources. In some instances, the processors of the replaceable hardware accelerator sled 305 may be configured especially for specific computing tasks, such as through the customization of programmable hardware accelerators of the hardware accelerator sled 305 for specific calculations, such as for calculation of impedance calculations for candidate circuit designs being evaluated by machine learning systems attempting to identify optimal circuit board designs. In this same manner, the capabilities of hardware accelerator sled 305 may be utilized in a wide variety of computing tasks.

At the front 350a of the processing layer 355b, embodiments may include a I/O module 325 that includes an integrated network controller that provides network access to the hardware accelerator sled 305. In some instances, the integrated network controller of I/O module 325 may also be utilized by components of the control layer 355a, such as motherboard 315. However, in some embodiments, the network controller of I/O module 325 may be utilized strictly by the components of processing layer 355b, while the components of processing layer 355b may rely strictly on networking capabilities supported by motherboard 315. For instance, motherboard 315 may rely strictly on networking capabilities provided by a remote access controller mounted on motherboard 315. For instance, motherboard 315 may rely on a remote access controller 230 that includes a network adapter for use in the remote management of chassis 300, such as in relaying telemetry data collected using the sideband management connections 230a supported by the remote access controller, as described with regard to FIG. 2. By segregating the network access by components of control layer 355a to use of a network adapter of motherboard 315, the operations by components of the control layer 355a result in minimal amounts of additional heat being generated by the I/O module 325 on behalf of the control layer 355a, thus preserving the ability for the cooling capabilities of the processing layer 355b to keep up with cooling demands of that layer.

Embodiments also include a PCIe switch that is integrated in I/O module 325 located in the processing layer 355b. In some embodiments, the PCIe switch of the I/O module 325 may include one or more PCB cards with connectors by which the hardware accelerator sled 305 is couped to the PCIe switch 330. As illustrated, I/O module 325 may also include connectors by which motherboard 315 is coupled to the I/O module 325, and thus the integrated PCIe switch and network controller capabilities of the I/O module 325. In some embodiments, motherboard 315 may be coupled to I/O module 325 upon insertion of a motherboard sled 105 including motherboard 315 into the control layer 355a bay of the chassis 300, where the motherboard sled may be pushed into the control layer 355a bay of the chassis until PCIe connectors of the motherboard sled are coupled to connectors supported by the I/O module 325. In some embodiments, the PCIe switch of I/O module 325 may include multiple PCIe connectors by which additional PCIe devices may be coupled to chassis 300. For instance, a structure supporting multiple drive bays may be attached to the front 350a of chassis. Each of these bays may support storage drives, such as an SSD (solid-state drive), that are coupled to a PCIe connector supported by PCIe switch of the I/O module 325, thus further augmenting the capabilities of chassis 200.

As described, data center administrators may be tasked with adding, removing or otherwise servicing components of chassis 300. Accordingly, embodiments support the ability for the I/O module 325 including the integrated network controller and PCIe switch to be removed via the front 350a of chassis 300. For instance, a data center administrator may decouple I/O module 325 from the hardware accelerator sled 305 (and in some cases, also from the motherboard sled) in order to then pull the I/O module 325 outwards via an opening in the front 350a of chassis 300. In this manner, a PCIe switch and network controller may remain coupled to each other while a data center administrator pulls them outward from the front 350a of chassis as a unitary I/O module 325 that can be separately replaced in chassis 300.

As illustrated in FIG. 3, a bank of 4 RU cooling fans 320 is located in the rear compartment 360c of chassis 300. As described, hardware accelerators may generate significant amounts of heat as a result of being tasked with computationally intensive processing loads, such as computations in support of machine learning and other artificial intelligence systems. In existing systems, cooling requirements for hardware accelerators have been addressed through the addition of heatsinks. The volume required for the installation and operation of such heatsinks result in chassis heights of 8 RU. The inventors of recognized that the cooling requirements for replaceable hardware accelerators, such as hardware accelerator sled 305, may instead be addressed using an optimized arrangement of computing components within a 6 RU chassis, where this arrangement supports the cooling requirements of the hardware accelerator sled 305 using a 4 RU block of cooling fans 320.

In this optimal arrangement of components within chassis 300, the replaceable hardware accelerator sled 305 is located within a central compartment 360b of the processing layer 355b. However, as described, hardware accelerator capabilities of a chassis 300 may be modified for various reasons, such as to customize the computational capabilities of the chassis to a specific set of computational tasks, or such as in response to a change in ownership or leasing of chassis 300. Accordingly, datacenter administrators require the ability to occasionally access and replace the hardware accelerator sled 305. Preferably, components of a chassis 300 are replaced or otherwise serviced without having to remove the chassis from the rack in which it is installed. Embodiments provide such capabilities through the ability to remove hardware accelerator sled 305 from chassis 300 without having to remove chassis 300 from the rack in which it is installed.

In support of the ability to quickly remove hardware accelerator sled 305 from the within the central compartment 360b of the processing layer 355b, the hardware accelerator sled 305 may include a handle 375 that may be used by the data center administrator to pull the hardware accelerator sled 305 out of the processing layer bay of the chassis 300. In FIG. 3, the handle 375 of the hardware accelerator sled 305 is in a stored position, thus allowing the bank of cooling fans 320 to be installed directly adjacent to the hardware accelerator sled 305 and maximizing use of space within the processing layer 355b of high-density chassis 300. In this stored position of FIG. 3, a cross member of the handle is not visible. This cross member 515 is identified in the deployed position of FIGS. 5A-C and is also visible in deployed handle 420 of FIGS. 4B and 4C. In the stored position, this cross member is not visible because it is nested within a corresponding cavity of the bank of cooling fans 320. In this cavity of the bank of cooling fans 320, the cross member of the handle remains in a position that, once the bank of cooling fans 320 has been removed, allows an administrator to easily reach into the central compartment of the chassis in order to pull the cross member of the handle 375 such that the handle rotates into a deployed position. From this deployed position, the handle allows the administrator to slide the hardware accelerator sled 305 out from the central compartment.

Figure 4A:
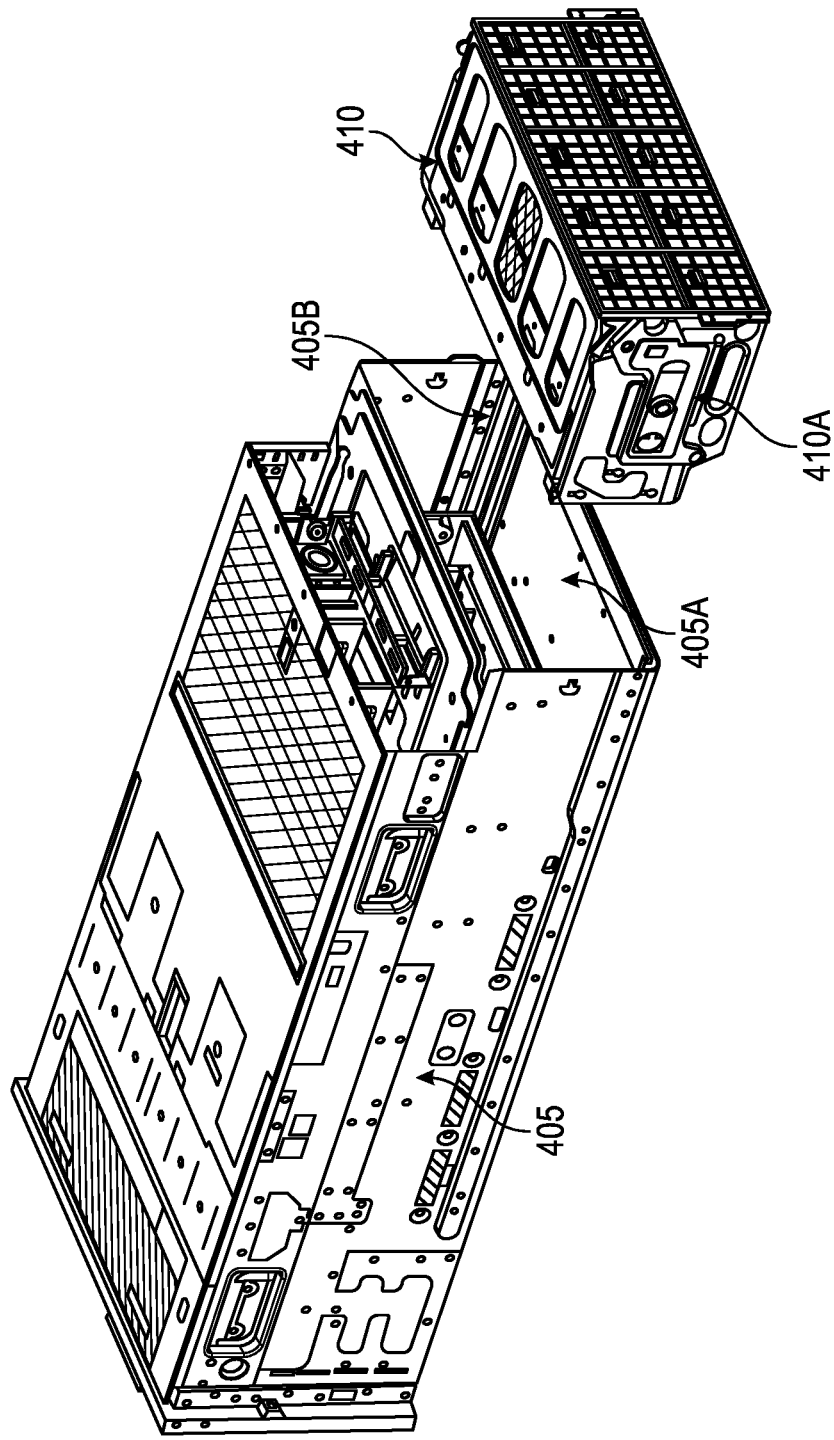
FIG. 4A is an illustration of the decoupling of the components of a processing layer of a chassis, according to embodiments.
Figure 4B:
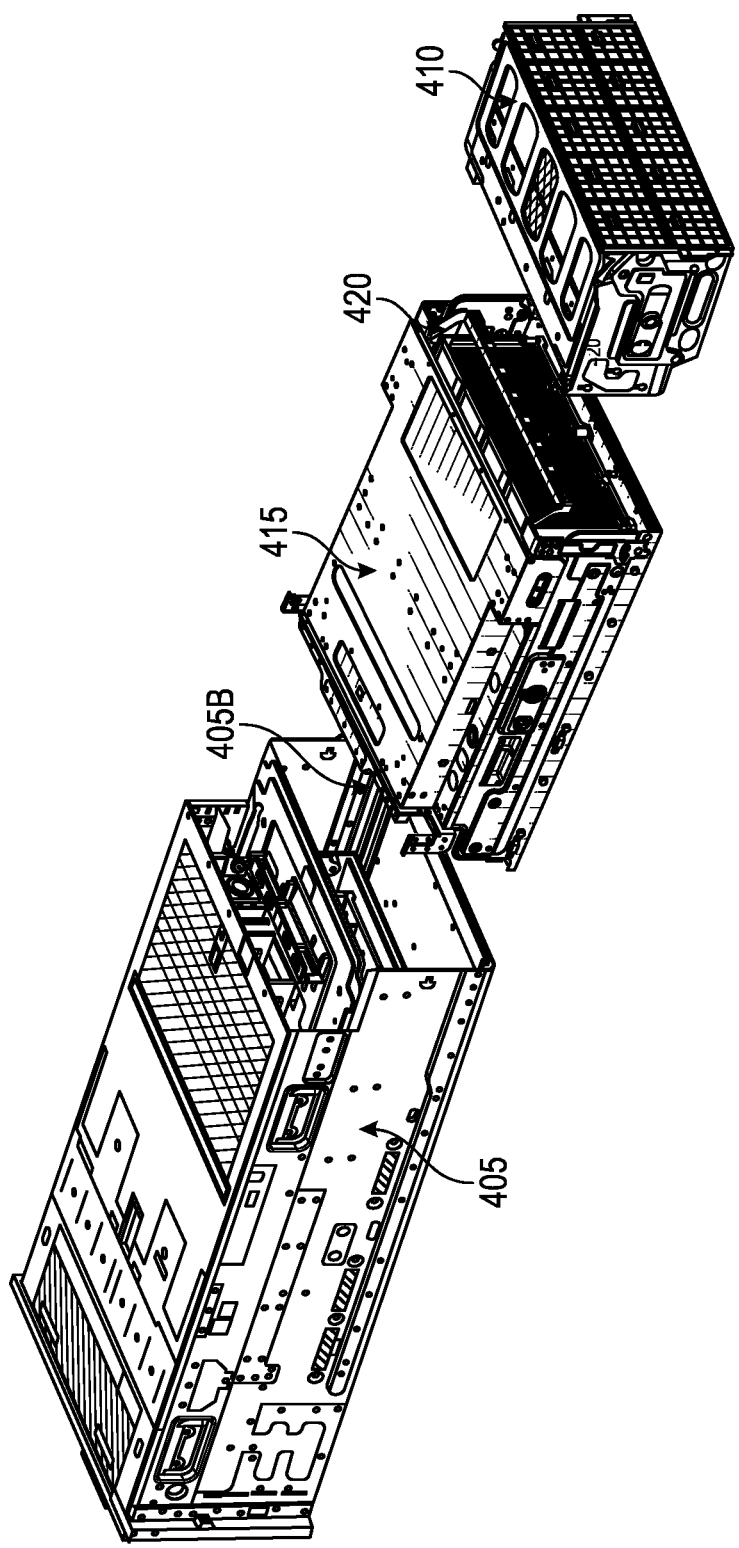
FIG. 4B is an additional illustration of the decoupling of the components of a processing layer of a chassis, according to embodiments.
Figure 4C:
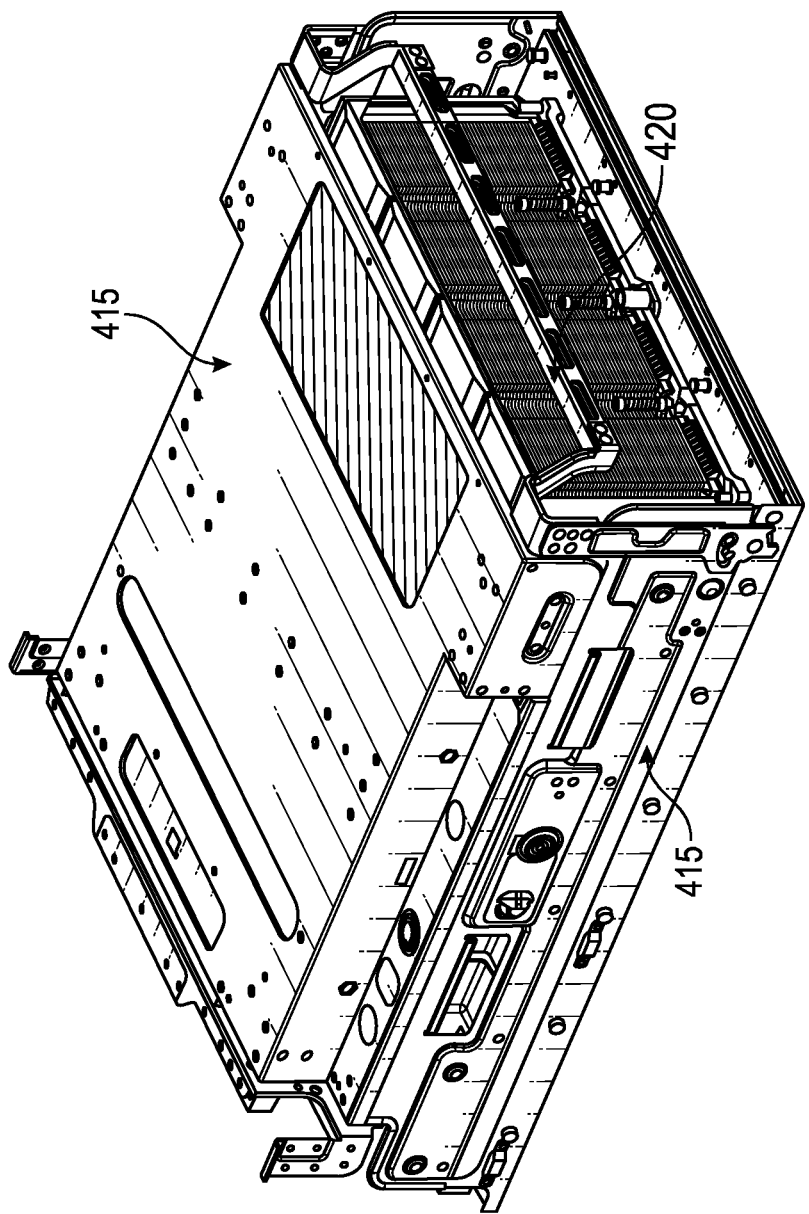
FIG. 4C is an illustration of a replaceable hardware accelerator components of a processing layer of a chassis, according to embodiments.

As illustrated in FIGS. 4A-C and 5A-B, embodiments support the ability for administrators to remove replaceable hardware accelerator sled 305 from within the central compartment 360b of the processing layer 355b. FIG. 4A is an illustration of the decoupling of the bank of cooling fans 320 from the processing layer of a chassis 405 according to embodiments. In particular, the administrator decouples the 2 RU bank of fans 410 from the hardware accelerator sled 415, leaving hardware accelerator sled 415 within the processing layer 355b of the chassis 405. Once the decoupled, the bank of fans 410 may be pulled outward from the rear compartment of the chassis by the administrator. In some embodiments, the decoupling of the bank of cooling fans 410 serves to release a handle 420 of the hardware accelerator sled 415 from its stored position.

FIG. 4B is an additional illustration of the decoupling of the components of a processing layer of a chassis, according to embodiments. In FIG. 4B, the data center administrator has decoupled the bank of cooling fans 410 from the hardware accelerator sled 415 and has also pulled the hardware accelerator sled 415 from within the processing layer of chassis 405. Once removed from chassis 405, an administrator may replace the hardware accelerator sled 415 of FIG. 4C within another sled that is compatible with the high-density chassis 405 according to embodiments. In other instances, the administrator may open hardware accelerator sled 415 and service the hardware accelerator cards installed within the sled. The new or serviced hardware accelerator sled 415 may then be re-inserted into the central compartment of the processing layer of chassis 405.

Figure 5A:
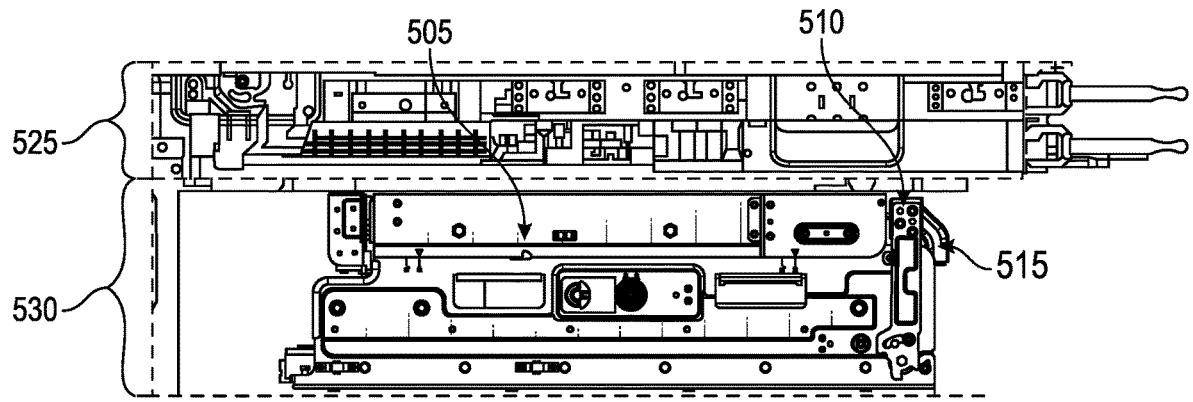
FIG. 5A is an illustration of the removal of a replaceable hardware accelerator sled from within a processing layer of a chassis, according to embodiments.

FIG. 5A is an illustration of the removal of a replaceable hardware accelerator sled 505 from within the processing layer of a chassis, according to embodiments. As above, a chassis includes a 2 RU control layer 525 and a 4RU processing layer 530, where the processing layer includes a replaceable hardware accelerator sled 505 that is installed within a central compartment. As in FIG. 3, in FIG. 5A, the handle 510 of the replaceable computing unit 505 is illustrated in its stored position. Since the bank of cooling fans has been removed, the cross member of the handle 510 is visible. However, as described above, the cross member of the handle fits within a corresponding cavity of the bank of cooling fans, such that the bank of cooling fans may be installed directly adjacent to the hardware accelerator sled 505, thus maximizing use of space in the processing layer 530 of the chassis and maximizing the ability of the cooling fans to draw heated air away from the hardware accelerator sled.

Figure 5B:
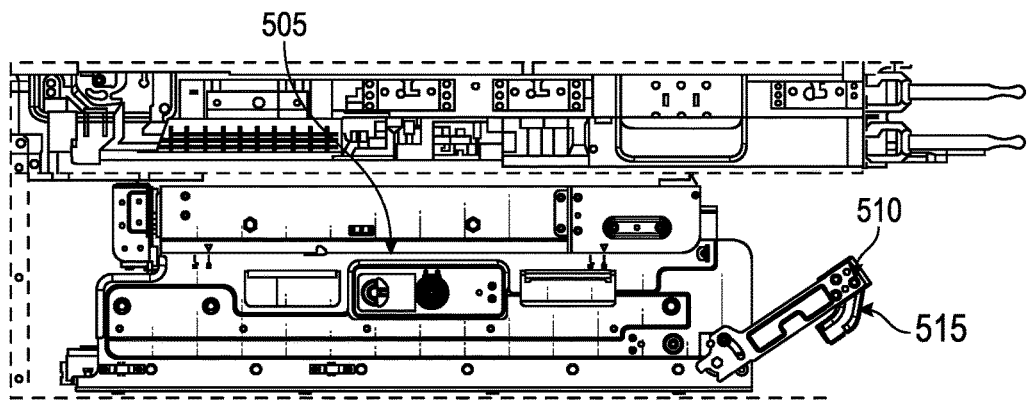
FIG. 5B is an additional illustration of the removal of a replaceable hardware accelerator sled from within a processing layer of a chassis, according to embodiments.
Figure 5C:
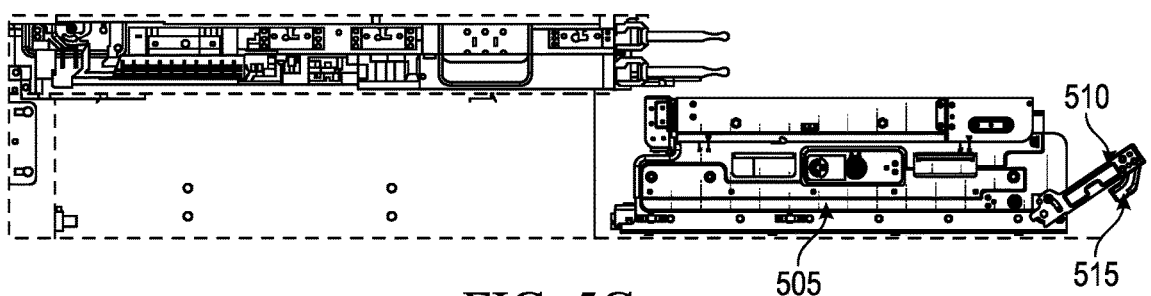
FIG. 5C is an additional illustration of the removal of a replaceable hardware accelerator sled from within a processing layer of a chassis, according to embodiments.

Once the bank of cooling fans has been removed from the rear compartment of the processing layer, as illustrated in FIG. 5B, the handle 510 remains in its stored position, but with the cross member 515 now exposed, thus allowing the administrator to rotate the handle to the deployed position of FIG. 5B and use the handle 510 to pull the hardware accelerator sled 505 out from within the central compartment of the processing layer, as illustrated in FIG. 5C. Once service of the hardware accelerator sled 505 has been completed, in this same manner, an administrator may use the handle 510 to push the hardware accelerator sled 505 back into the central compartment of the processing layer of the chassis until the hardware accelerator sled is coupled to the I/O module located in the front compartment of the processing layer. Through the administrator pushing the hardware accelerator sled 505 into the central compartment until it interfaces with I/O module, the handle 510 is rotated back to the stored position, but, in some embodiments, only locks into the stored position once the hardware accelerator sled 505 has been properly connected to the I/O module. Embodiments thus provide a toolless and time-saving mechanism for servicing a hardware accelerator sled, while still providing sufficient cooling for this hardware accelerator sled, all within a 6 RU chassis.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A chassis housing one or more Information Handling Systems (IHSs), the chassis comprising:
a control layer, comprising:
a power supply for use by components installed in the control layer of the chassis and for use by components installed in a processing layer of the chassis,
a motherboard comprising one or more CPUs (Central Processing Units), wherein the CPUs are coupled to the processing layer via a PCIe fabric; and
the processing layer, comprising:
one or more I/O modules installed in a front compartment of the processing layer, wherein the I/O modules are replaceable via the front of the processing layer,
a hardware accelerator sled installed in a central compartment of the processing layer, wherein the hardware accelerator sled is replaceable via a rear of the processing layer, wherein the hardware accelerator sled comprises a handle used for pulling the hardware accelerator sled from the center compartment of the chassis, wherein the handle is rotated upwards to a stored position upon insertion of the hardware accelerator sled into the center compartment of the processing layer of the chassis and coupling the hardware accelerator sled to the I/O module, wherein, when the handle is rotated upwards to a stored position, a block of cooling fans is installed directly against the hardware accelerator sled within the processing layer of the chassis, wherein, when the handle is rotated upwards to a stored position and the block of cooling fans is installed directly against the hardware accelerator sled, the handle of the hardware accelerator sled is nested within a cavity of the block of cooling fans; and
the block of cooling fans installed in a rear compartment of the processing layer, wherein the block of cooling fans provide airflow cooling to the I/O modules installed in the front compartment of the processing layer and to the hardware accelerator sled installed in the central compartment of the processing layer.

2. The chassis of claim 1, wherein a height of the control layer is 2 RU (Rack Units).

3. The chassis of claim 2, wherein a height of the processing layer is 4 RUs.

4. The chassis of claim 3, wherein a height of the chassis is 6 RUs.

5. The chassis of claim 1, wherein the control layer further comprises a plurality of motherboard fans providing cooling in the control layer.

6. The chassis of claim 1, wherein the one or more I/O modules replaceable via the front compartment of the processing layer comprise a plurality of network controllers.

7. The chassis of claim 1, wherein the one or more I/O modules replaceable via the front compartment of the processing layer comprise a plurality of PCIe switches, wherein the PCIe switches provide the PCIe fabric coupling the CPUs of the motherboard to the processing layer.

8. The chassis of claim 1, wherein the hardware accelerator sled comprises a plurality of GPU (Graphics Processing Unit) cards.

9. The chassis of claim 1, wherein the hardware accelerator sled comprises a plurality of DPU (Data Processing Unit) cards.

10. The chassis of claim 1, wherein the handle is rotated downwards in order to decouple the hardware accelerator sled from the I/O module and to pull the hardware accelerator sled from within the center compartment of the processing layer of the chassis.

11. An Information Handling System (IHS) housed within a 6 RU (Rack Unit) chassis, the IHS comprising:
a power supply installed within a 2 RU control layer of the chassis and supplying power for use by components installed in the control layer of the chassis and power for use by components installed in a 4 RU processing layer of the chassis;
a motherboard installed within the 2 RU control layer of the chassis, wherein the motherboard comprises one or more CPUs (Central Processing Units), and wherein the CPUs are coupled to components in the processing layer of the chassis via a PCIe fabric;
one or more I/O modules installed in a front compartment of the 4 RU processing layer of the chassis, wherein the I/O modules are replaceable via the front of the processing layer;
a hardware accelerator sled installed in a central compartment of the 4 RU processing layer of the chassis, wherein the hardware accelerator sled is replaceable via a rear of the processing layer, wherein the hardware accelerator sled comprises a handle used for pulling the hardware accelerator sled from the center compartment of the chassis, wherein the handle is rotated upwards to a stored position upon insertion of the hardware accelerator sled into the center compartment of the processing layer of the chassis and coupling the hardware accelerator sled to the I/O module, wherein, when the handle is rotated upwards to a stored position, a block of cooling fans is installed directly against the hardware accelerator sled within the processing layer of the chassis, wherein, when the handle is rotated upwards to a stored position and the block of cooling fans is installed directly against the hardware accelerator sled, the handle of the hardware accelerator sled is nested within a cavity of the block of cooling fans; and the block of cooling fans installed in a rear compartment of the 4 RU processing layer of the chassis, wherein the block of cooling fans provide airflow cooling to the I/O modules installed in the front compartment of the processing layer and to the hardware accelerator sled installed in the central compartment of the processing layer.

12. The IHS of claim 11, wherein the hardware accelerator sled comprises a plurality of GPU (Graphics Processing Unit) cards.

13. The IHS of claim 11, wherein the control layer further comprises a plurality of motherboard fans providing cooling in the control layer.

14. The IHS of claim 11, wherein the one or more I/O modules replaceable via the front compartment of the processing layer comprise a plurality of network controllers.

15. The IHS of claim 11, wherein the one or more I/O modules replaceable via the front compartment of the processing layer comprise a plurality of PCIe switches, wherein the PCIe switches provide the PCIe fabric coupling the CPUs of the motherboard to the processing layer.

16. A system comprising:
a 2 RU (Rack Unit) control layer of a 6 RU chassis, the control layer comprising:
a power supply for use by components installed in the control layer of the chassis and for use by components installed in a processing layer of the chassis,
a motherboard comprising one or more CPUs (Central Processing Units), wherein the CPUs are coupled to the processing layer via a PCIe fabric; and
the 2 RU processing layer of the 6 RU chassis, the processing layer comprising:
one or more I/O modules installed in a front compartment of the processing layer, wherein the I/O modules are replaceable via the front of the processing layer of the chassis;

a hardware accelerator sled installed in a central compartment of the processing layer, wherein the hardware accelerator sled is replaceable via a rear of the processing layer of the chassis, wherein the hardware accelerator sled comprises a handle used for pulling the hardware accelerator sled from the center compartment of the chassis, wherein the handle is rotated upwards to a stored position upon insertion of the hardware accelerator sled into the center compartment of the processing layer of the chassis and coupling the hardware accelerator sled to the I/O module, wherein, when the handle is rotated upwards to a stored position, a block of cooling fans is installed directly against the hardware accelerator sled within the processing layer of the chassis, wherein, when the handle is rotated upwards to a stored position and the block of cooling fans is installed directly against the hardware accelerator sled, the handle of the hardware accelerator sled is nested within a cavity of the block of cooling fans; and the block of cooling fans installed in a rear compartment of the processing layer, wherein the block of cooling fans provide airflow cooling to the I/O modules installed in the front compartment of the processing layer and to the hardware accelerator sled installed in the central compartment of the processing layer of this chassis.

17. The system of claim 16, wherein the hardware accelerator sled comprises a plurality of GPU (Graphics Processing Unit) cards.

18. The system of claim 16, wherein the control layer further comprises a plurality of motherboard fans providing cooling in the control layer.

19. The system of claim 16, wherein the one or more I/O modules replaceable via the front compartment of the processing layer comprise a plurality of network controllers.

20. The system of claim 16, wherein the one or more I/O modules replaceable via the front compartment of the processing layer comprise a plurality of PCIe switches, wherein the PCIe switches provide the PCIe fabric coupling the CPUs of the motherboard to the processing layer.

* * * * *